United States Patent
Pawlenko et al.

(10) Patent No.: US 7,113,410 B2
(45) Date of Patent: Sep. 26, 2006

(54) ELECTROMAGNETIC SHIELD ASSEMBLY WITH OPPOSED HOOK FLANGES

(75) Inventors: Ivan Pawlenko, Holland, PA (US); Larry Samson, Langhorne, PA (US)

(73) Assignee: Lucent Technologies, Inc., Murray Hill, NJ (US)

(*) Notice: Subject to any disclaimer, the term of this patent is extended or adjusted under 35 U.S.C. 154(b) by 0 days.

(21) Appl. No.: 10/816,354

(22) Filed: Apr. 1, 2004

(65) Prior Publication Data

US 2005/0219832 A1    Oct. 6, 2005

(51) Int. Cl.
*H05K 9/00* (2006.01)

(52) U.S. Cl. ............... 361/818; 361/800; 361/816; 147/35 R; 147/35 GC; 29/830

(58) Field of Classification Search ........... 361/800, 361/818, 816; 174/35 R, 35 GC
See application file for complete search history.

(56) References Cited

U.S. PATENT DOCUMENTS

| 5,164,886 | A |   | 11/1992 | Chang |
|-----------|---|---|---------|-------|
| 5,353,201 | A | * | 10/1994 | Maeda .................. 361/816 |
| 5,354,951 | A | * | 10/1994 | Lange et al. ............ 174/35 R |
| 5,392,192 | A |   | 2/1995  | Dunn et al. |
| 5,495,399 | A |   | 2/1996  | Gore et al. |
| 5,883,791 | A | * | 3/1999  | Deguchi .................. 361/818 |
| 5,917,710 | A |   | 6/1999  | Määttä |
| 5,999,416 | A |   | 12/1999 | McAnally et al. |
| 6,002,086 | A | * | 12/1999 | Yajima .................. 174/35 R |
| 6,005,186 | A |   | 12/1999 | Bachman |
| 6,011,700 | A | * | 1/2000  | Matsuzaki ............... 361/816 |
| 6,051,781 | A |   | 4/2000  | Bianca et al. |
| 6,181,573 | B1 | * | 1/2001 | Riet ..................... 361/816 |
| 6,301,125 | B1 | * | 10/2001 | Maeda .................. 361/818 |
| 6,500,012 | B1 |   | 12/2002 | Billenstein et al. |
| 6,552,261 | B1 |   | 4/2003  | Shlahtichman et al. |
| 6,754,088 | B1 | * | 6/2004 | Takeda .................. 361/818 |
| 6,872,881 | B1 | * | 3/2005 | Horng .................. 174/35 GC |
| 6,949,706 | B1 | * | 9/2005 | West ..................... 174/35 R |
| 2002/0012241 | A1 | * | 1/2002 | Takeda .................. 361/818 |

* cited by examiner

*Primary Examiner*—Kamand Cuneo
*Assistant Examiner*—Dameon E. Levi

(57) ABSTRACT

An electromagnetic shield structure (100) has an elongated conductive wall (102) that continuously or discontinuously defines a shielding perimeter and has a flange (104) laying over laterally to form a J-shaped hook (106) in cross section. A conductive cover or lid (108) engages over the standing wall (102) and has a depending side wall skirt (110) that has a flange (112) and forms a J-shaped hook (114) facing opposite from the hook (106) of the elongated wall (102). The cover (108) is pressed onto the wall (102) for assembly, causing the flanges (104) and (112) to deflect and snap over one another in the space between the overlapping skirt (110) and wall (102). The shield enclosure (122) can be disassembled without damage by applying a tool (116) through an opening (118) in the outer one of either the skirt (110) or wall (102), to deflect and disengage the flanges (104) and (112) in the space between the overlapped skirt (110) and wall (102).

14 Claims, 3 Drawing Sheets

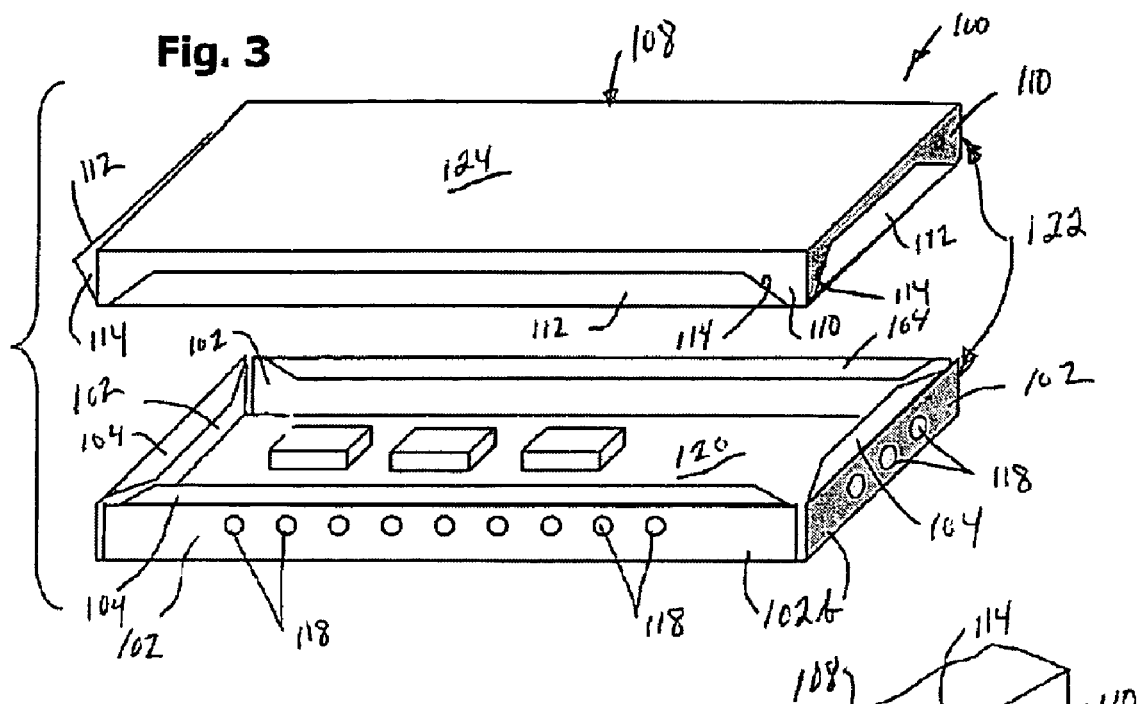
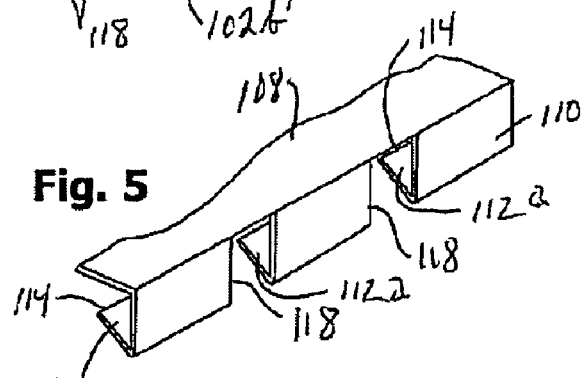
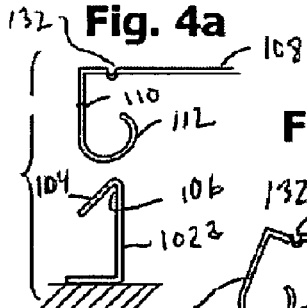
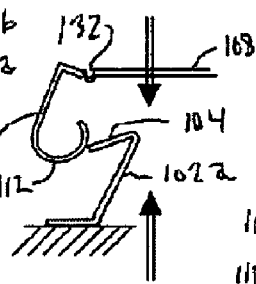
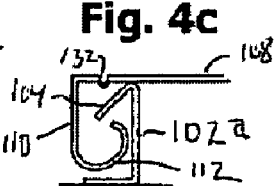
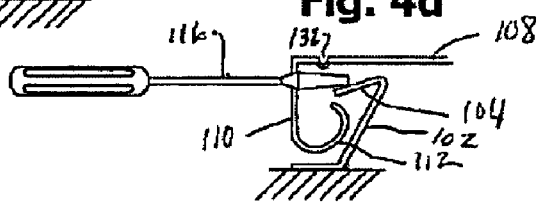

ELECTROMAGNETIC SHIELD ASSEMBLY WITH OPPOSED HOOK FLANGES

FIELD OF THE INVENTION

The invention relates to mechanically and electrically coupling conductive panels and other shapes to form whole or partial electromagnetic shielding enclosures. Two conductive elements are coupled by passing opposed J-shaped flange edges resiliently over one another until the hooked J-shapes pass, snapping the parts into attachment. An accessible one of the J-shaped flanges has an opening for receiving a tool by which the captive flanges can be separated, namely by depressing the inner J-shaped flange of the pair.

BACKGROUND

Some electrical and electronic circuits generate undesirable electromagnetic emissions and some circuits are adversely affected by electromagnetic emissions from other circuits. There are various causes for electromagnetic emission and for sensitivity to emissions. Current levels, conductor lengths, inductance, high frequency operation, and high slew rates (e.g., from switching inductive loads) contribute to generating electromagnetic interference or "EMI." High amplifier gains, low common mode rejection, low signal to noise ratios and other factors contribute to circuit sensitivity to incoming noise.

One technique for blocking the propagation of emissions, either incoming or outgoing, is to place a conductive barrier such as a metal sheet or screen, across the propagation path. An incident electromagnetic signal induces current in the conductive barrier, but the propagating signal is attenuated, particularly if the barrier is connected along a low resistance path to the applicable signal ground reference.

Therefore, problematic sensitive and/or high frequency circuits are often shielded by grounded conductive barriers. In one example, box-like sheet metal structures wholly or partly enclose around such circuits. In other examples, enclosures are formed of conductive polymers, or coated with conductive foils or conductive paints. The enclosures can be rigid or flexible, and can be box shaped, cylindrical, domed or otherwise shaped to define an enclosure of conductive material around the applicable circuit.

Shielding panels need not be wholly continuous, and there may be cooling interests as well as shielding interests. A conductive enclosure around a circuit can have holes or slots, or can be constructed using a conductive mesh screen. Shields having holes or slots or other openings can be effective as conductive barriers for frequencies at and below a characteristic frequency related to the size of the holes. For relatively higher frequency shielding, any holes through the shield barrier need to be relatively smaller, etc.

In connection with a printed circuit board arrangement, a rectilinear sheet metal box often is used as all or part of the shield barrier. A box can be formed by folding an integral sheet and/or attaching together two or more integral sheets so that the sheets together form a conductive barrier in the required shape.

Assuming the example of a rectilinear box on a printed circuit board, conductive portions of the board can define part of the barrier around a given circuit element, or barriers can be provided on opposite sides if necessary. On a given side, standing conductive walls of thin sheet metal can extend from the plane of the circuit board, e.g., extending perpendicularly upwardly from a folded flange attached to the board, or carried by one or more integral tabs that engage openings on or through the board as attachment pegs, feet, floor panel elements or the like.

The standing wall elements act as the panels of a fence defining a perimeter and keeping the EMI emissions of the circuit in or out. The panels need to be mechanically mounted to remain in position, and electrically connected to one another and to one or more points on the circuit board, typically a common ground point.

Many of the same shielding concerns that are involved in forming an enclosure around elements on a printed circuit card are encountered in building cabinets for apparatus. For example, shielding is advantageous and may be required by regulatory authorities, for equipment such as computer cabinets (e.g., PCs, servers, mainframes, etc.), peripherals (printers, scanners, modems), radio frequency transmission and reception devices (receivers, television sets) and the like. In addition to enclosing sensitive elements on circuit cards, circuit subsets may need enclosures (such as power supplies, disk drives and other devices that are internal to a cabinet). Cabinet structural panels need to be attached, and various ports that might permit propagation of electromagnetic fields, such as backplane circuit connector openings, need to be bridged over or plugged by a conductive cover. Although designers sometimes opt for relatively permanent attachments, it is advantageous if provisions are made whereby such shielding can be disassembled and reassembled or perhaps varied to accommodate different specific combinations of circuit elements in a cabinet or on a circuit card, e.g., to provide connector access to expansion card slots on a computer motherboard.

The need for effective electromagnetic shielding suggests that conductive parts of a shield should be securely affixed, both electrically and mechanically. On the other hand, convenience of assembly and controlling the cost of shielding parts may lead toward less secure or durable structures. What is needed is a good balance of interests.

Shield enclosures typically comprise inexpensive thin sheet metal stampings of aluminum, stainless steel or another material. There may be instances where it is desirable, e.g., for compactness and to reduce internal enclosure dimensions, to provide a shield with a complicated shape, but more often it is desirable to minimize expense by using a minimum of stamping steps, to produce a simple structure such as a box, a cylinder with an end cap, a covered rectangular opening or the like.

An exemplary simple structure could resemble the walls and lid of a shoe box, with a rectilinear perimeter of standing walls and a lid. To provide a connection and facilitate disassembly if necessary, the lid can have resiliently biased gripping structures overlapping the top edges of the side walls.

U.S. Pat. No. 6,552,261—Shlahtichman et al. discloses a push-fit shield enclosure comprising a box with walls covered by a lid having spaced fingers for resiliently gripping over the outside edges of the box walls. U.S. Pat. No. 5,354,951—Lange Sr. et al. discloses an arrangement in which finger-like projections of the walls grasp resiliently around the outer edges of a lid panel. Shield enclosures built by assembling resilient grasping structures are convenient to assemble and can be readily disassembled if necessary, but they are not very secure.

U.S. Pat. No. 6,005,186—Bachman discloses a shield plug that can be fit into an opening in a computer back panel to seal a circuit card connector opening. The plug has resiliently deformable depressions that are intended to become depressed by the edges of an opening in a cabinet wall when the plug is inserted to close the opening. The deformable depressions are spaced from associated flanges by a distance approximately equal to the thickness of the cabinet wall. When the plug is installed, the depressions are resiliently compressed in passing through the opening, and snap outwardly again as the plug is fully seated, holding the plug securely in place. A similar snap fit for affixing the lid of a shielding box structure is disclosed in U.S. Pat. No. 5,495,399—Gore et al., wherein resilient depressions and complementary openings are placed in the perimeter walls of a shield box and in the overlapping flanges of a box lid.

Such structures ensure that the lid (or plug or other filling structure) become securely affixed. However, they are somewhat difficult to disassemble. Disassembly that involves prying apart engaged snap fittings and the like often results in damage to the shield structures or to the shielded parts.

It would be desirable to provide a technique whereby simple shielding enclosures could be made without the need for great precision in the size and shaping of the parts, so as to minimize expense. At the same time, however, such shielding enclosures need to be mechanically secure as well as providing dependable low resistance electrical connections. On the other hand, provisions should be made for convenient disassembly when necessary, without substantially compromising the security of the connections in normal use.

SUMMARY OF THE INVENTION

According to one aspect of the present invention, an electromagnetic shielding structure has an elongated conductive wall forming a support member standing on a base edge. This wall can be a conductive fence portion that continuously or discontinuously defines a shielding perimeter around a circuit element. This standing wall has a flange, preferably at its edge spaced from the base edge, the flange laying over laterally to one side so as to form a J-shaped hook in cross section.

A conductive cover member such as the lid of a shielding box engages over the standing wall, thus making electrical contact for completing the shield barrier from the wall to the cover member or lid. The cover member has at least one depending side wall that likewise has a flange and forms a J-shaped hook in cross section. The hook of the cover faces opposite from the hook of the standing wall. Assembly is accomplished by applying force to press the cover member onto the standing wall, thereby causing one or both of the flanges resiliently to deflect laterally toward its respecting wall. A the flanges pass, the cover and wall snap into mechanical engagement.

This structure of engaging J-hooks would normally result in a relatively permanent attachment because the J-hooks engage in the inaccessible space between the lid wall and the supporting wall. Prying the lid from the support would require the flanges to be deformed to the extent that they might not be reusable. According to another aspect of the invention, one of the lid wall and the supporting wall, namely an accessible outer one, has an opening dimensioned to receive a tool whereby the flanges can be disengaged by lateral force to disengage the flanges in the sealed area under the cover, i.e., inside the lid wall.

BRIEF DESCRIPTION OF THE DRAWINGS

The invention can be understood from the following detailed description when read in conjunction with the accompanying drawing. It is emphasized that, according to accepted practice, the features of the drawing are not necessarily to scale and may be shown arbitrarily expanded or reduced for clarity. The same numerals are used to denote the same features throughout the specification and drawings, wherein:

FIG. 1 is an exploded perspective view illustrating one embodiment of the subject invention, the cover member being disposed to be pressed downwardly to engage with complementary flanged support members on a base structure such as a circuit card, cabinet opening or the like.

FIG. 3 is an exploded perspective view illustrating an alternative embodiment.

FIGS. 4a–4d are section views corresponding to FIG. 2 but showing an alternative embodiment, FIGS. 4a and 4b showing stages of assembly, FIG. 4c showing the assembled state, and FIG. 4d showing a disassembly step.

FIG. 5 is a partial perspective view of an alternative embodiment wherein one of the lid skirt flange and the support member flange has a discontinuous structure of spaced fingers.

DETAILED DESCRIPTION

Figure 1:
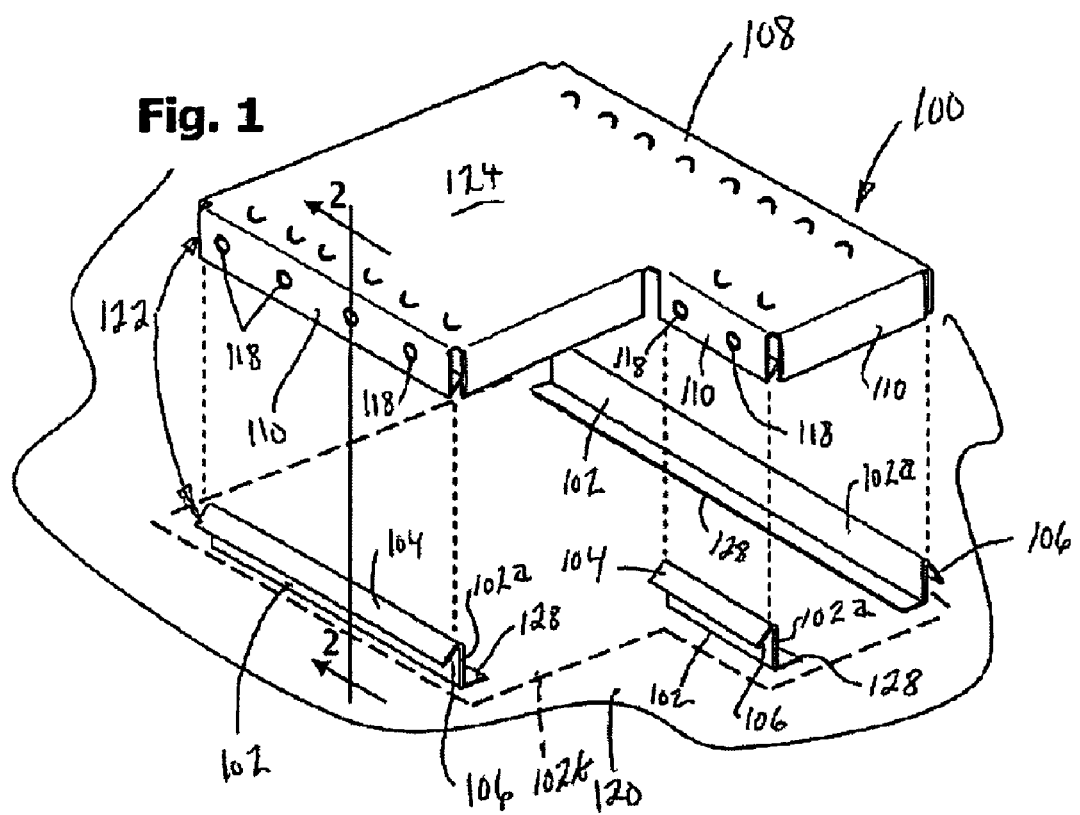

The inventive electromagnetic shielding structure, shown in FIGS. 1–5, involves an electromagnetic shield structure (100) having an elongated conductive support member (102) having a standing wall (102a) or fence (102a) that continuously or discontinuously defines a shielding perimeter (102b) and has a flange (104) laying over laterally to form a J-shaped hook (106) in cross section. A conductive cover (108) or lid engages over the standing wall (102) and has a depending side wall skirt (110) that has a flange (112) and forms a J-shaped hook (114) facing opposite from the hook (106) of the elongated wall (102). The cover (108) is pressed onto the wall (102) for assembly, causing the flanges (104) and (112) to deflect and snap over one another in the space between the overlapping skirt (110) and wall (102). The shield enclosure (100) can be disassembled without damage by applying a tool (116) through an opening (118) in the outer one of the skirt (110) and wall (102), to deflect and disengage the flanges (104) and (112) in the space between the overlapped skirt (110) and wall (102).

A number of variations are possible, including a range of structures as shown in the drawings wherein the standing wall (102a) and/or wall skirt (110) are more or less complete as a perimeter enclosure, or more or less continuous across a surface (120). Likewise, different exemplary cross sectional shapes are shown. These particulars are intended to illustrate the basic structural aspects together with the functions served according to the invention, but not to comprehensively demonstrate all the ways that they can be embodied according to their inventive aspects.

This description of exemplary embodiments is to be read in connection with the accompanying drawings, which form a part of the description. In each view, the parts are shown and described in certain configurations or orientations for convenience or by way of example. Therefore, relative spatial terms such as "lower," "upper," "horizontal," "vertical," "above," "below," "up," "down," "top" and "bottom" as well as derivatives thereof (e.g., "horizontally," "downwardly," "upwardly," etc.) refer to the orientation as then being described or as shown in the drawing under discussion. These terms for convenience of description should not be construed to require that the apparatus be constructed or operated in a particular orientation, unless so stated.

Similarly, terms found in this description concerning attachments, coupling and the like, such as "connected" and "interconnected," refer to a relationship wherein structures are secured or attached to one another either directly or indirectly through intervening structures, as well as connections that may be movable or rigid. Additionally, connection of the parts by engaging slots and edges as described should not be read as excluding additional attached parts or additional means of attachment of the engaged parts, for example by soldering after the parts have been engaged.

Referring to FIG. 1, an electromagnetic shielding structure (100) is shown in an example wherein the upper part forms substantially an enclosure (122) with integral top wall (124) and side walls (110), whereas the bottom portions substantially comprise elongated fence sections (102) that are mounted on an underlying structure (120) such as a printed circuit board.

As shown in FIG. 1, an elongated support member (102) comprises a conductive wall (102a) extending from a base edge (126) and having a flange (104), the flange (104) of the support member (102) being spaced from the base edge (126) and oriented at an angle with respect to the wall portion (102a). Accordingly, in cross section the flange (104) of the support member (102) and the conductive wall (102a) form an elongated substantially J-shaped hook (106) carried on the base edge (126). The J-shaped hook (106) opens downwardly toward the underlying structure (120) on which the hooked support member (102) is mounted.

In this embodiment, the flange (126) serving as the base part or foot that lies against the underlying structure (120) is located on one side of the standing wall portion (102), and the hook part (106) is located on the opposite side. The base (foot) (126) and hook (106) could also be on the same side. In this embodiment, the J-shaped hook (106) of the standing wall (102a) faces generally outwardly from the perimeter of the enclosure (122) whereas the hook (106) on the cover part (108) faces inwardly. This relationship can also be reversed. These and other variations are shown in examples discussed hereinafter.

As shown in FIG. 1, a cover member (108) defines a covering wall (124) spaced above the supporting base part (102). The cover member (108) has a conductive side wall or skirt wall (110) that is substantially coextensive with the conductive wall (102a) of the support member (102) mounted on the PC board (120), when assembled therewith. The cover member (108) has a panel (124) extending laterally from the side wall at a space from the support member (102), namely the lid or top wall (124). Further, the cover member (108) has a flange (112) extending from the side wall (110), in a direction opposite from the extension of the flange (104) on the standing wall part (102a). That is, the flange (112) on the skirt conductive side wall (110) of the cover member (108) forms a substantially J-shaped hook (114) around the panel (124) of the cover member (108), and that J-shaped hook (114) is opposed to and is engageable with the J-shaped hook (106) on the standing wall (102a).

The J-shaped hooks (106) and (114) of the support member (102) and the cover member (108), respectively are located and sized to engage one another to mechanically thereby attach the cover member (108) to the support member (102). The J-shaped hooks (106) and (114) are also located and sized to bear against one another in conductive contact. Thus the mechanical contact of the conductive parts also entails electrical connection of the cover part (108) with the side wall (102a), for completing at least part of an electromagnetic sealing barrier. Provided that the standing wall part (102a) is coupled electrically to a circuit ground on the PC board (120), the structure (100) forms a convenient snap-together shield against propagating electromagnetic fields.

Figure 2:
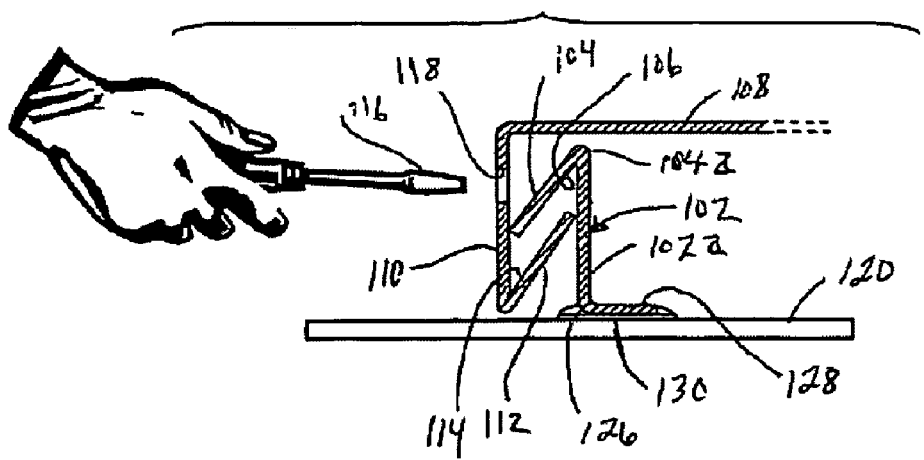
FIG. 2 is a partial section view showing a step in disassembly of the embodiment according to FIG. 1.

In FIG. 1, the cover part (108) is exploded from the standing wall parts (102) with which the cover (108) can be snapped together. FIG. 2 shows a cross section of a portion of the wall (102) as assembled. The flange parts (104) and (112) of the J-shaped hooks (106) and (114) at least partly overlap and interfere with one another during the motion of snapping the cover part (108) down onto the standing walls (102). Depending on the relative rigidity of the structures, parts of the J-shaped hooks (106) and (114) and their supporting structures can be resiliently deformed such that the free ends of the flanges of each of the two J-shaped hooks (106) and (114) pass by one another. Upon passing, the J-shaped hooks (106) and (114) become engaged in a manner that locks the cover (108) onto the standing walls (102).

In FIG. 1, the side walls or skirts (110) around the cover (108) form a full perimeter. The standing walls (102) on the PC board (120) do not form a complete perimeter but nevertheless are located at opposite sides of the perimeter. As such, a pair of spaced standing members (102) complement the spacing of the opposite side walls or skirts (110) around the lid (108). Of course, in an alternative embodiment, the standing wall support member (102a) can define the perimeter wall (102) of a sealing enclosure (122) or both the skirt (110) and the standing wall parts (102) can be substantially complete perimeters, as shown in FIG. 3.

The illustrated cover member (108) defines a lid and the panel (124) covers an opening in an sealing enclosure (122) wherein the standing members (102) are disposed around the perimeter. A J-shaped hook arrangement could also be provided wherein the J-shaped hooks (106) and (114) that engage are coupled to a lid (108) that is cantilevered in one or two opposite directions from an engagement of J-shaped hooks (106) and (114), e.g., along a center line (not shown).

The support members (102) in FIG. 1 each define an elongated sheet structure having a base (128) at the base edge (126), attached at an angle or fold to the conductive standing wall (102a), in this case at a right angle. The flange (104) forming the J-hook (106) of the support member (102) is connected at a fold (104a) with the conductive wall (102a), but the angle is acute so as to capture the opposed hook (114).

More particularly, the two opposed walls (110) and (102a) respectively define larger and smaller perimeters so that the one surrounds the other, with the flange (114) forming the J-hook (116) of the outer one (110) facing in the direction of the inner one (112), and vice versa. In the embodiment shown in FIGS. 1 and 2, the side wall (110) of the cover member (108) is the outer one and has a J-hook flange (114) facing inwardly toward the conductive wall (102a) of the support member (102). A space is defined between the inner surface of the cover side wall (110) and the outer surface of the standing wall (102a). The flanges (104) and (112) of the support member (102) and the cover member (108) both reside in this space between the walls (102a) and (110) and mutually engage around one another for capturing the cover member (102) on the support member (102).

The flanges (106) and (114) also provide sufficient vertical clearance such that during assembly, the two flanges (106) and (114) and/or the walls (102a) and (110) on which the flanges (106) and (114) are carried can be depressed sufficiently that the extreme ends of the flanges (106) and (114) can be passed vertically beyond each other, permitting the flanges (106) and (114) to snap back into the position shown in FIG. 2, where the cover (108) and the standing wall (102a) are respectively captured. The standing wall (102a) is also attached to the underlying surface (120), in this case being affixed to the PC board by solder (130).

The flanges (104) and (112) of the portions that form the standing wall (102a) and the cover (108), respectively, can be reversed in their directions as shown in FIG. 3, wherein the standing walls (102a) define the larger span and/or perimeter and the cover (108) is the smaller. The flanges (104) and (112) also can have various specific shapes. For example, FIGS. 4a–4d show an embodiment in which at least one of the flanges (112) or (104) in this example the flange (112) of the cover (108) has a rolled shape forming a rounded or rib-like shape that is passed by the opposed flange (112). Either or both of the flanges (104) and (112) can be similarly rounded. If both flanges (104) and (112) are rounded or otherwise provided with inclined surfaces facing both upwardly and downwardly (see example in FIG. 6), it is possible to pry upwardly under the edge of the outer flange (114) in order to detach the flanges (104) and (112). Upward force in that case also urges the flanges (104) and (112) to detach and pass over one another.

According to an inventive aspect, a positive capturing shape for the J-shaped hooks (106) and (114) can be provided as shown in FIG. 2, namely one wherein upward force locks the hooks (106) and (114) together instead of displacing the hooks (106) and (114) laterally. Nevertheless, arrangements are made for detaching the cover (108) without damage. As seen in FIG. 2, prying against the surface (120) of the PC board and under the outer flange (112) lifts the cover flange (116) into closer engagement with the standing wall flange (104), would simply pull the hooks (106) and (114) of the flanges (104) and (112) more directly and securely together. Further prying would risk detaching the standing wall (102a) from the PC board surface (120) or would permanently deform one or both flanges (106) and (114) before the cover (108) and the standing wall (102a) could be detached, because the J-shaped flanges (106) and (114) positively hook around and into one another.

According to an inventive aspect, at least one of the side wall (110) of the cover member (108) and the conductive wall (102a) of the support member (102) has an opening (118) dimensioned to receive a tool (116) whereby one of the flanges (104) and (112) of the cover member (108) and the support member (102) can be pushed laterally sufficiently to disengage the other of the flanges (104) and (112), for disassembling the shielding and sealing structure (100). As shown in FIG. 2, the mutually opposite shapes of the J-shaped hooks (106) and (114) are such that the flanges (104) and (112) at the free ends of the hooks (106) and (114) are inclined relative to one another in a direction that permits the flanges (104) and (112) to pass over inclined planes, but only in the assembly direction.

FIG. 2 illustrates using a screw driver as the tool (116) for reaching through the opening (118) in the outer wall (110), over the flange (112) integral with the outer wall (110), so as to depress the inner wall (102a) and its flange (112). As shown in FIG. 3, in an arrangement wherein the sense or genders of the cover (108) and the standing walls (102a) is reversed, the openings (118) are provided in the accessible outer wall (102a), in this case to depress the flange (112) on the skirt or wall (110).

The J-shaped flanges (106) and (114) of the cover member (108) and the support member (102) are placed to bear against one another during assembly of the shielding and sealing structure by pressing the cover member (108) against the support member (102), in a vertical direction as shown in FIGS. 1 and 2. FIGS. 4a to 4c show the deformation and snap-back sequence of positions as the cover (108) and the standing wall (102a) and the flanges (106) and (114) are pressed together. FIG. 4d illustrates use of a screw driver or similar tool (116) for depressing the inner flange (104) for later disassembly.

The upper and lower J-shaped flanges (104) and (112) are in position so as to overlap and can be at least partly inclined in shape. The flanges (104) and (112) are also made of resilient material or are resiliently attached. By positioning the flanges (104) and (112) at least partly over one another (FIG. 4a) and pressing them together (FIG. 4b), one of both of the flanges (104) and (112) becomes displaced laterally in a direction away from the other flange (104) and (112). When the flanges (104) and (112) are passed vertically beyond a certain point, the flanges (104) and (112) snap around one another (FIG. 4c), and the parts (108) and (102) become mechanically attached. Preferably, the flanges (104) and (112) are also dimensioned so that when attached the flanges (104) and (112) bear resiliently against one another for secure electrically conductive contact. By further providing an opening (118) for access to the inner member (102), and as shown in FIG. 4d, the parts (108) and (102) are likewise detachable.

The standing wall (102) and the cover (108) can be made of sheet metal such as thin steel, aluminum or the like. Such material normally is inherently resilient, and has sufficient shape memory to enable the flanges (104) and (112) to be engaged and disengaged repeatedly. FIGS. 1 and 4a–4d show an example in which at least one weakened stress concentration zone (132) is placed between one of the flanges (104) and (112) and the respective one of the panel (108) and wall (102a) on which the flange (104) or (112) is carried. In this arrangement, lateral displacement of the associated one of said flanges (104) and (112) can include flexing of the weakened zone (132), as shown by the upper member (108) in FIG. 4b. As shown by the bottom member (102) in FIG. 4b, the flange (104) and its standing wall (102a) can also be resiliently deformed by the assembly process and when being depressed by the screw driver or other tool (116).

In FIG. 5, the openings (118) in a wall (110) having a downward inward flange direction are provided by shaping the flanges (112) along discontinuous fingers (112a). The access for the tool (116) in this case can be made through gaps (118) between the fingers (112a), which comprise J-shaped hooks (114) in the form of discontinuous sections that individually engage with the other of the flanges (other flange not shown in FIG. 5).

Figure 6:
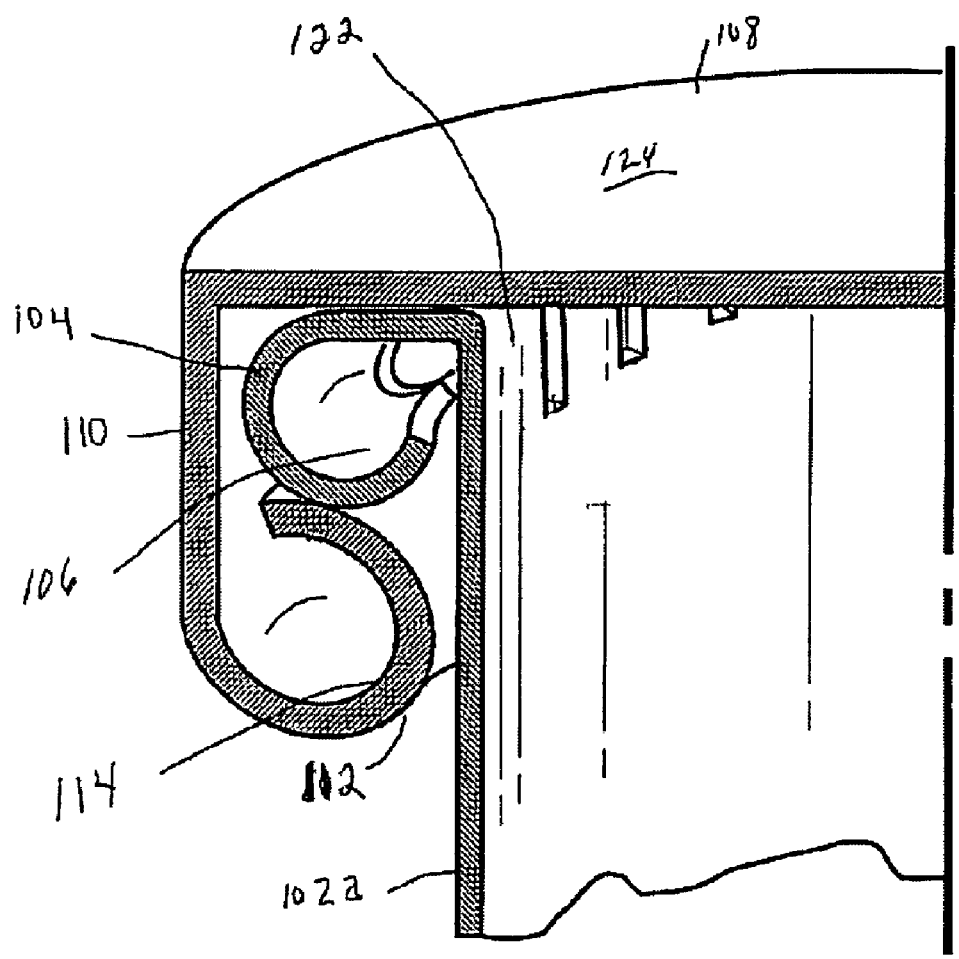
FIG. 6 is a partial perspective view showing a further embodiment.

The invention as described is subject to variations that also are electrically and mechanically attachable and detachable as described. For example, FIG. 6 shows a further embodiment in which both the inner and outer flanges (104) and (112) have rolled rib shapes. An opening (not shown) can be provided in the outer wall (110) to permit insertion of a tool (not shown in this embodiment), or in view of the rounded rib shape the flanges (112) or (104) are accessible externally of the enclosure (122) and can be pried or otherwise forced over one another for disassembly.

In view of the variations in structure that are possible, the invention can be considered a method for electromagnetic shielding, as well as the particular structures as exemplified in the foregoing discussion. The method comprises providing a standing support member (102) elongated along at least a portion of a perimeter area to be shielded, the support member (102) standing on a supporting base structure (130) and having a flange (104) spaced from the base structure (130) and oriented laterally of the support member (102), at least part of the support member (102) being electrically conductive. A conductive cover member (108) is engaged on the support member (102) so as to electrically and mechanically couple with the support member (102), the cover member (108) having a side wall (110) that overlaps the support member (102) and a flange (112) that is oriented laterally of the side wall (110) and opposite from the flange (104) on the support member (102). The flanges (104) of each support member (102) and the side wall (110) of the cover member (108) are placed to bear against one another in a space between the support member (102) and the side wall (110), and wherein said engaging comprises applying a force to snap the flanges (104) and (112) over one another in assembling the cover member (108) onto the support member (102).

Assembly involves resiliently deflecting at least one of the flanges (104) and (112) laterally relative to the other of the flanges (104) and (112) in snapping the flanges (104) and (112) over one another. For assembly, the flanges (104) and (112) can be forced against one another, whereupon one or both of the flanges (104) and (112) are resiliently deformed laterally and snap back together again after reaching a certain relative displacement. Disassembly likewise involves resilient deformation, which according to the invention can require a tool (116) in view of a structure with mutually engaging hook flanges (104) and (112), or in some arrangements, as in FIG. 6, can potentially involve resiliently snapping a cover (108) from a ribbed flange (104).

In any event, deflecting at least one of the flanges (104) and (112) can include flexing a weakened zone (132) between the said one of the flanges (104) and (112) and a respective one of the support member (102a) and the cover (108).

As also described above, at least one of the support member (102) and the side wall (110) can have at least one opening (118) for receiving a tool (116) to engage against one of the flanges (104) and (112) in a space between the support member (102) and the side wall (110) as assembled together. By applying a tool (116) through the opening (118), it is possible to resiliently urge one of the flanges (104) and (112) to disengage from the other of the flanges (104) and (112) for disassembling the cover member (108) and the support member (102) from one another.

Although the invention has been described in terms of exemplary embodiments, it is not limited thereto. Rather, the appended claims should be construed broadly, to include other variants and embodiments of the invention, which may be made by those skilled in the art without departing from the scope and range of equivalents of the invention.

What is claimed is:

1. An electromagnetic shielding structure, comprising:
   an elongated support member comprising a conductive wall extending from a base edge and having a flange, the flange of the support member being spaced from the base edge and oriented at an angle with respect to the wall portion, wherein the flange of the support member and the conductive wall form an elongated substantially J-shaped hook carried on the base edge;
   a cover member comprising a conductive side wall substantially coextensive with the conductive wall of the support member and a panel extending laterally from the side wall, the cover member comprising a flange extending from the side wall, wherein the flange and the side wall of the cover member form a substantially J-shaped hook around the panel of the cover member;
   wherein the J-shaped hooks of the support member and the cover member are located and sized to engage one another for mechanically and electrically attaching the cover member to the support member for completing at least part of an electromagnetic sealing barrier, and furthermore, the side wall of the cover member and the conductive wall of the support member overlap one another and define a space between said side wall and said conductive wall, wherein the flanges of the support member and the cover member reside in the space and mutually engage one another for holding the cover member on the support member.

2. The electromagnetic sealing structure of claim 1, wherein the support member defines part of a perimeter wall of a sealing enclosure.

3. The electromagnetic sealing structure of claim 1, wherein the cover member defines a lid and the panel covers an opening in an sealing enclosure.

4. The electromagnetic sealing structure of claim 1, wherein the support member defines an elongated sheet structure having a base at the base edge, attached at an angle to the conductive wall, and the flange of the support member is connected at a fold with the conductive wall.

5. The electromagnetic sealing structure of claim 1, wherein one of the side wall of the cover member and the conductive wall of the support member has an opening dimensioned to receive a tool whereby one of the flanges of said cover member and said support member can be pushed laterally sufficiently to disengage the other of the flanges, for disassembling the sealing structure.

6. The electromagnetic sealing structure of claim 1, wherein the flanges of the cover member and the support member are placed to bear against one another during assembly of the sealing structure by pressing the cover member against the support member, and wherein at least one of said flanges is resiliently attached so as to become displaced laterally and snap around the other of said flanges during said assembly.

7. The electromagnetic sealing structure of claim 6, further comprising at least one weakened zone between one of the flanges and a respective one of the base edge and the panel, and wherein lateral displacement of said at least one of said flanges includes flexing of the weakened zone.

8. The electromagnetic sealing structure of claim 1, wherein at least one of the flanges comprises a J-shaped hook that comprises a plurality of discontinuous sections that individually engage with the other of the flanges.

9. The electromagnetic sealing structure of claim 1, wherein the cover member and the support member each comprise integral sheet metal forms.

10. The electromagnetic sealing structure of claim 9, wherein the support member is one of a plurality of spaced support members fencing around at least part of a volume to be shielded.

11. A method for electromagnetic shielding, comprising:
   providing a standing support member elongated along at least a portion of a perimeter area to be shielded, the support member standing on a supporting base structure and having a flange spaced from the base structure and oriented laterally of the support member, at least part of the support member being electrically conductive;
   engaging a conductive cover member on the support member so as to electrically and mechanically couple with the support member, the cover member having a side wall that overlaps the support member and a flange that is oriented laterally of the side wall and opposite from the flange on the support member;

wherein the flanges of support member and the side wall of the cover member are placed to bear against one another in a space between the support member and the side wall, and wherein said engaging comprises applying a force to snap the flanges over one another in assembling the cover member onto the support member.

12. The method of claim 11, further comprising resiliently deflecting at least one of the flanges laterally relative to the other of the flanges in snapping the flanges over one another.

13. The method of claim 12, wherein deflecting said at least one of the flanges includes flexing a weakened zone between the said one of the flanges and a respective one of the support member and the side wall.

14. The method of claim 11, wherein at least one of the support member and the side wall has at least one opening for receiving a tool to engage against one of the flanges in a space between the support member and the side wall as assembled together, and further comprising applying a tool through the opening to resiliently urge one of said flanges to disengage from the other of the flanges for disassembling the cover member and the support member from one another.

* * * * *